(12) United States Patent
Miyakawa et al.

(10) Patent No.: US 7,594,805 B2
(45) Date of Patent: Sep. 29, 2009

(54) ADHESIVE INJECTION APPARATUS

(75) Inventors: Nobuaki Miyakawa, Wako (JP);
Hiroyuki Toshima, Saitama (JP);
Natsuo Nakamura, Wako (JP);
Takahiro Kimura, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 740 days.

(21) Appl. No.: 11/193,368

(22) Filed: Aug. 1, 2005

(65) Prior Publication Data
US 2006/0021706 A1 Feb. 2, 2006

(30) Foreign Application Priority Data
Aug. 2, 2004 (JP) .............................. 2004-225949

(51) Int. Cl.
*H01L 21/56* (2006.01)
(52) U.S. Cl. .................. 425/110; 425/123; 425/127
(58) Field of Classification Search .................. 425/110, 425/127, 123
See application file for complete search history.

(56) References Cited
U.S. PATENT DOCUMENTS 5,203,076 A * 4/1993 Banerji et al. ................ 29/840
5,866,442 A * 2/1999 Brand ......................... 438/108
6,436,331 B1 * 8/2002 Kuno et al. .............. 264/272.17
6,780,747 B2 * 8/2004 Distefano et al. ............ 438/124
6,861,278 B2 * 3/2005 Quinones et al. ............ 438/127

FOREIGN PATENT DOCUMENTS

JP 11-261001 A 9/1999

* cited by examiner

*Primary Examiner*—Robert B Davis
(74) *Attorney, Agent, or Firm*—Birch, Stewart, Kolasch & Birch, LLP

(57) ABSTRACT

Adhesive injection apparatus, designed to inject an adhesive into gaps between a plurality of layers of flat plate members, includes: a receptacle for holding therein the flat plate members; an evacuation section for evacuating the interior of the receptacle and the gaps between the flat plate members; an adhesive supply section for supplying the adhesive into the receptacle; and a gas introduction section for introducing a gas into the receptacle to produce a pressure difference between the interior of the receptacle and the gaps between the flat plate members, so as to allow the adhesive to be injected from all around the flat plate members into the gaps.

14 Claims, 5 Drawing Sheets

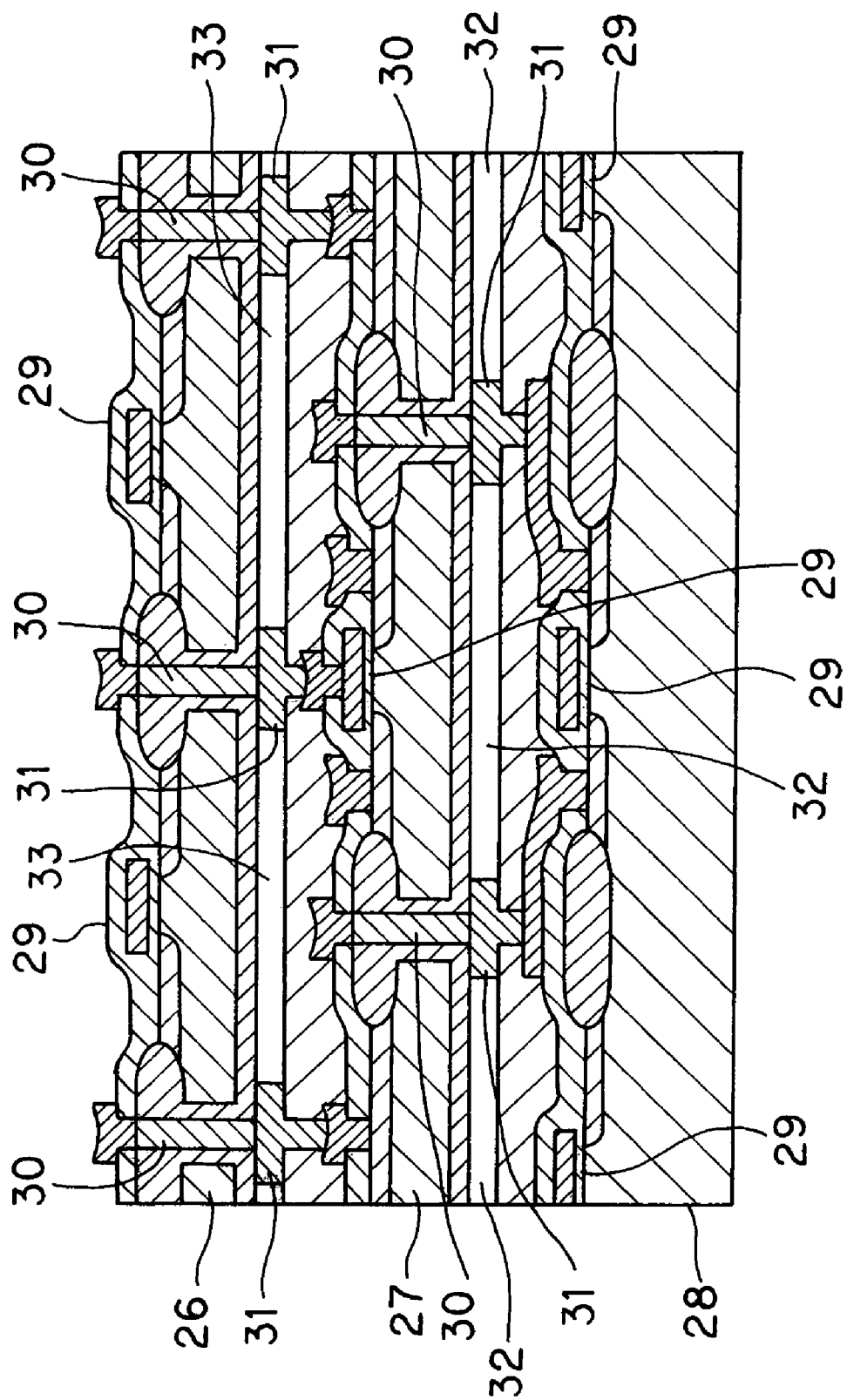

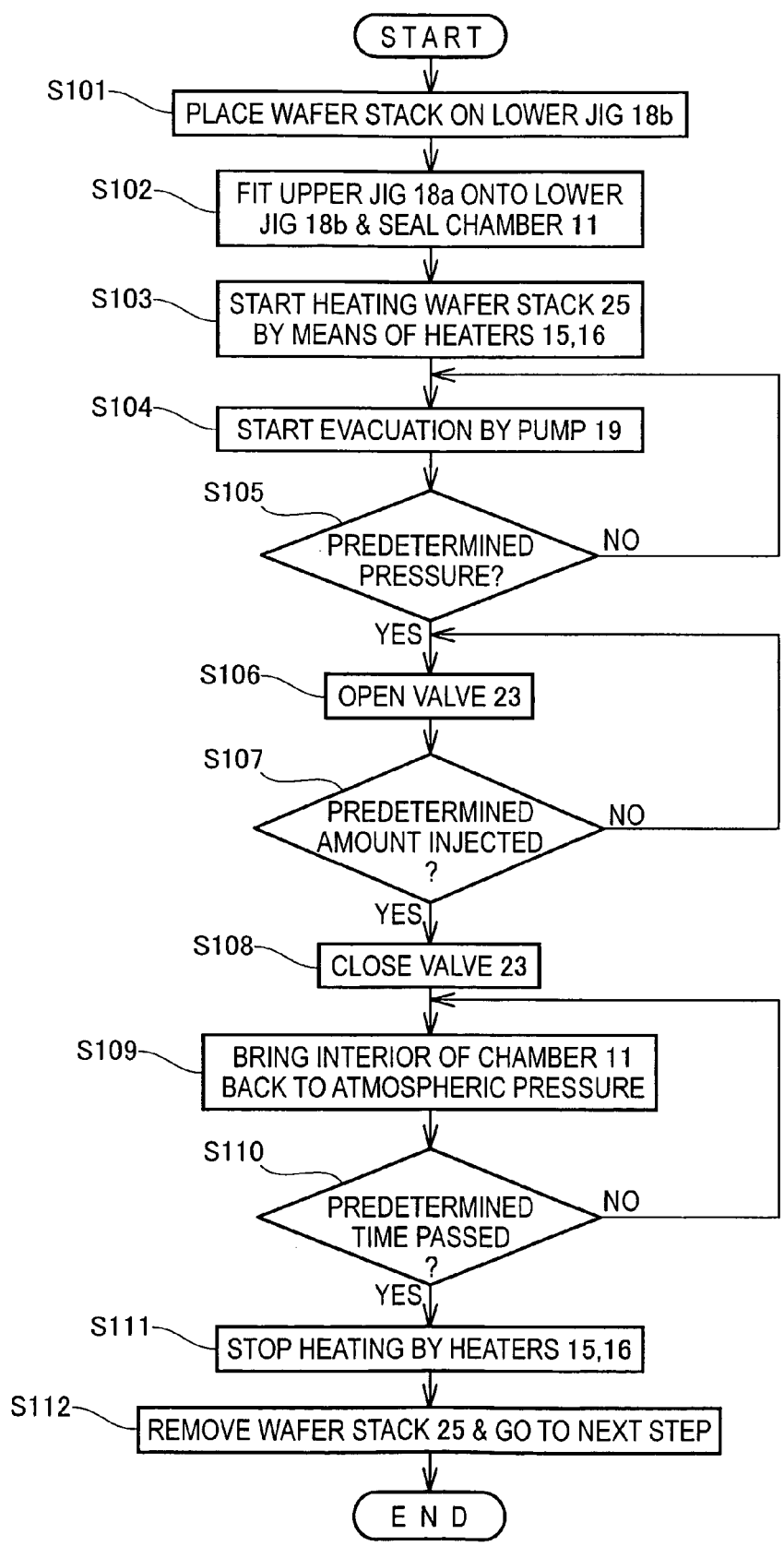

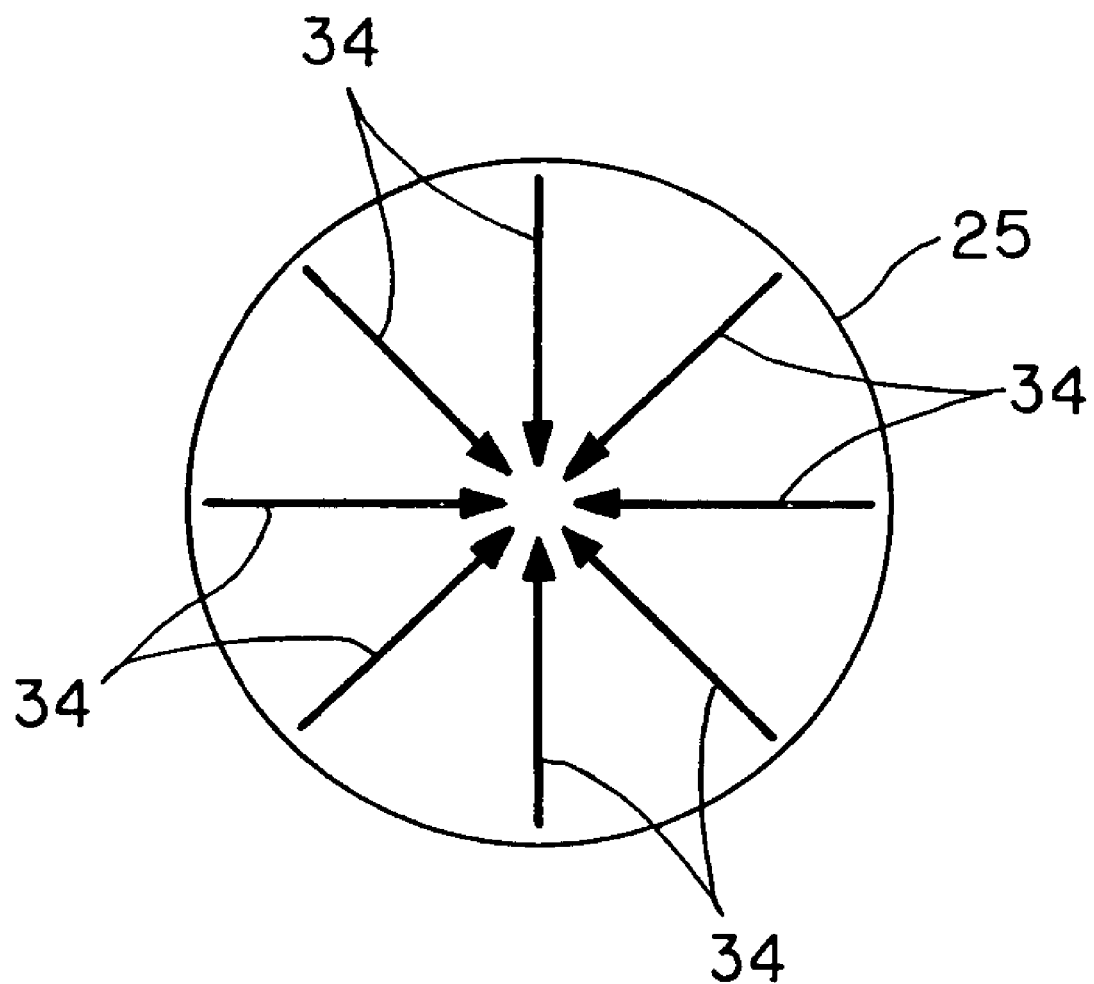

ADHESIVE INJECTION APPARATUS

FIELD OF THE INVENTION

The present invention relates generally to adhesive injection apparatus and methods, and more particularly to an improved adhesive injection apparatus and method for use in manufacturing of three-dimensional semiconductor integrated circuit devices etc.

BACKGROUND OF THE INVENTION

Three-dimensional semiconductor integrated circuit devices have been known, in which two or more layers of wafers, each having a semi-conductor device or semiconductor integrated circuit device previously formed therein, are stacked vertically and the vertically-arranged semiconductor devices or semiconductor integrated circuit devices are electrically connected with each other via vertical wiring. For example, Japanese Patent Laid-Open Publication No. HEI-11-261001 discloses a method for manufacturing a three-dimensional semiconductor integrated circuit device, in accordance with which trenches (i.e., deep grooves) are formed in an upper-layer wafer having a semiconductor device or semiconductor integrated circuit device formed therein, wiring is embedded in each of the trenches of the upper-layer wafer, then a bump is formed on an end surface of each of the embedded wiring so that a lower-layer wafer, opposed to the upper-layer wafer and also having a semiconductor device or semiconductor integrated circuit device previously formed therein, is fixed to the upper-layer wafer at the bumps, and then an insulating adhesive is injected between the two stacked wafers, fixed together only at the bumps, to thereby manufacture a three-dimensional semiconductor integrated circuit device.

Prior to injecting the insulating adhesive between the two vertically-stacked wafers (collectively called "wafer stack") in accordance with the disclosed manufacturing method, all outer surface regions of each of the stacked wafer are sealed with a sealing section (sealing frame or sealing wall) except for an outer surface region corresponding to an adhesive injection port formed in the sealing section, and then the fixed-together stacked wafers are placed and held in a receptacle. After that, the interior of the receptacle is evacuated to be turned into a vacuum state. Subsequently, the stacked wafers are lowered so as to immerse the adhesive injection port in the adhesive. Then, the interior of the receptacle is brought back to the atmospheric pressure level with the adhesive injection port still kept immersed in the adhesive, and thus, a pressure difference is produced between the gaps between the stacked wafers and the interior of the receptacle so that the adhesive is injected from the adhesive injection port into the gaps. Consequently, the three-dimensional semiconductor integrated circuit device is strengthened by hardening of the adhesive injected into the gaps, but also the electric wiring is reliably sealed up.

In the case where the technique of the HEI-11-261001 publication is employed, all the outer surface regions of the stacked wafers, other than the surface region corresponding to the adhesive injection port, have to be sealed with the sealing section as noted above, which unavoidably increases the number of necessary processing steps. Further, portions of the stacked wafers located above and below the sealing section and peripheral edge portions of the wafers would be wasted, and the adhesive may not be injected up to portions of the wafers opposite and remote from the adhesive injection port.

Further, with the disclosed technique where the adhesive injection port is provided at a single location near one end of the wafer stack, the adhesive has to travel a very long distance from the injection port (the longest necessary traveling distance is almost equal to the diameter of the wafer stack), requiring a long adhesive injection time. If the necessary traveling distance of the injected adhesive is very long, a great difference in the traveling time of the adhesive, and hence non-uniformity in the injected amount of the adhesive, would result between portions of the wafer stack near the adhesive injection port and portions of the wafer stack remote from the adhesive injection port; in addition, it would become difficult to adjust the viscosity of the adhesive. Because the wafer diameter is getting bigger and bigger nowadays in the field of the semiconductor technology, it is apparent that the above-identified problems with the disclosed technique, such as the increased adhesive injection time, will become more and more prominent.

Furthermore, in the technique of the HEI-11-261001 publication, a particular mechanism has been necessary for vertically moving the wafer stack in the receptacle. There has also been a demand that the wafer stack prior to the adhesive injection be avoided from movement and mechanical contact with the outside as much as possible in order to protect microprocessed portions of the wafers.

SUMMARY OF THE INVENTION

In view of the foregoing prior art problems, it is an object of the present invention to provide an improved adhesive injection apparatus and improved adhesive injection method which allow an adhesive to be injected between stacked workpieces in a short period of time with utmost ease and uniformity.

In order to accomplish the above-mentioned object, the present invention provides an improved adhesive injection apparatus for injecting an adhesive into gaps between a plurality of layers of flat plate members, which comprises: a receptacle for holding therein the flat plate members; an evacuation section for evacuating the interior of the receptacle and the gaps between the flat plate members; an adhesive supply section for supplying the adhesive into the receptacle; and a gas introduction section for introducing a gas into the receptacle to produce a pressure difference between the interior of the receptacle and the gaps between the flat plate members, so as to allow the adhesive to be injected from all around the flat plate members into the gaps.

Preferably, the receptacle holds the flat plate members in a horizontal posture. In a preferred implementation, the adhesive injection apparatus further comprises a heating section for heating the receptacle. The heating section preferably changes its heating temperature in accordance with any of the planar surface area of the flat plate members, size of the gaps between the flat plate members, viscosity of the adhesive and the above-mentioned pressure difference. Preferably, the evacuation section is in the form of a pump for evacuating the interior of the receptacle. In a preferred implementation, the flat plate members are a plurality of layers of stacked wafers each having semiconductor integrated circuitry formed therein, and vertically adjacent ones of the wafers are electrically connected with each other via vertical wiring.

According to another aspect of the present invention, there is provided an improved adhesive injection method for injecting an adhesive into gaps between a plurality of layers of flat plate members, which comprises: a step of holding the plurality of layers of flat plate members in a receptacle; an evacuation step of evacuating the interior of the receptacle and the gaps between the plurality of layers of flat plate members; an adhesive supply step of supplying the adhesive into the receptacle; and a gas introduction step of introducing a gas into the receptacle to produce a pressure difference between the interior of the receptacle and the gaps between the flat plate members, so as to allow the adhesive to be injected from all around the flat plate members into the gaps.

According to the method of the present invention, the receptacle preferably holds the flat plate members in a horizontal posture. In a preferred implementation, the adhesive injection method further comprises a heating step of heating the receptacle. Preferably, the heating step changes a heating temperature in accordance with any of the planar surface area of the flat plate members, size of the gaps between the flat plate members, viscosity of the adhesive and the above-mentioned pressure difference. Preferably, the evacuation step evacuates the interior of the receptacle. In a preferred implementation, the flat plate members are a plurality of layers of stacked wafers each having semiconductor integrated circuitry formed therein, and vertically adjacent ones of the wafers are connected with each other via vertical wiring.

According to the present invention arranged in the above-mentioned manner, there is no need to provide a particular sealing section (sealing frame or wall) for the layers of flat plate members (e.g., a plurality of layers of stacked wafers, i.e. wafer stack), which can avoid an increase in the number of necessary steps and waste of peripheral edge portions of the wafers. Further, the present invention allows the adhesive to be injected toward the center of the wafer stack from all around the wafer stack, and thus, the overall traveling distance of the adhesive in the invention can be shorter than that in the conventional technique, which can achieve a reduced time of the adhesive injection step and uniform injection of the adhesive. Further, the present invention requires no mechanism for vertically moving the wafer stack in a vacuum chamber and can thereby avoid undesired vertical movement of the wafer stack during the injection of the adhesive. Further, because the wafer stack only has to be merely placed on a stable jig, the present invention can prevent an extra mechanical load from being applied to the wafer stack.

Further, in the preferred implementation where the wafer stack is kept heated during the adhesive injection, the viscosity of the adhesive can be lowered to permit prompt injection of the adhesive. Furthermore, by a pump continuing to vent gases until the interior of the vacuum chamber is brought back to the atmospheric pressure level, the present invention can quickly discharge gases produced by the heating of the wafer stack and injection of the adhesive (i.e., gases that would contaminate the surface of the wafers and have adverse effects, such as an increased degree of vacuum, on the adhesive injection operation) and reduce the adverse effects of the gases. Furthermore, because the present invention allows the adhesive to be injected from all around the wafer stack held in the horizontal posture, the adhesive can be injected between the stacked wafers extremely uniformly without being adversely influenced by the gravitational force and moving acceleration. With the arrangements set forth above, the present invention can inject the adhesive between the stacked wafers in a short period of time with utmost ease and uniformity, so that it can provide an improved adhesive injection apparatus and method which can achieve an enhanced yield and minimized cost. It should be appreciated that the present invention is applicable to any other workpieces than wafer stacks, such as those where an adhesive is to be injected efficiently into very narrow gaps formed between a plurality of opposed surfaces.

BRIEF DESCRIPTION OF THE DRAWINGS

Certain preferred embodiments of the present invention will hereinafter be described in detail, by way of example only, with reference to the accompanying drawings, in which:

FIG. 3 is a vertical sectional view of the stacked wafers;

FIG. 4 is a flow chart showing an example operational sequence of a adhesive injection process performed using the adhesive injection apparatus of the invention; and FIG. 5 is a view showing a manner in which an adhesive is injected into gaps between the stacked wafers.

DETAILED DESCRIPTION OF THE PREFERRED EMBODIMENTS

Figure 1:
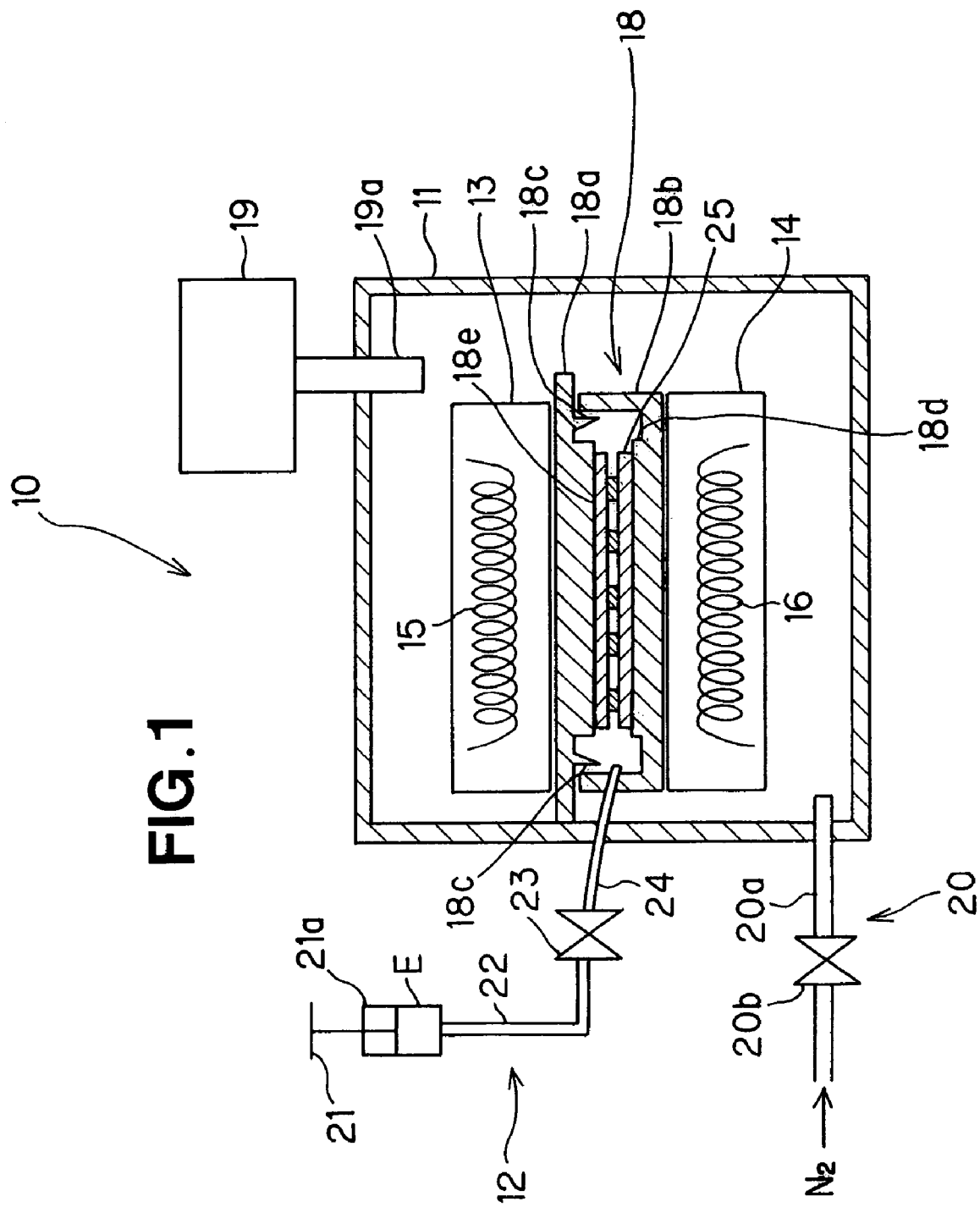
FIG. 1 is a sectional view of an adhesive injection apparatus in accordance with an embodiment of the present invention.

FIG. 1 is a sectional view of an adhesive injection apparatus in accordance with an embodiment of the present invention. The adhesive injection apparatus 10 includes: a vacuum chamber 11; an adhesive supply section 12; a receptacle 18 having upper and lower stages (fixing sections) 13 and 14, heating devices 15 and 16 and upper and lower jigs 18a and 18b; a pump or evacuation device 19; and an inert gas introduction section 20.

The adhesive supply section 12, which is a device for supplying an adhesive E in the form of liquid into the receptacle 18, includes a piston portion 21, supplying path 22, valve 23 and adhesive injecting portion 24. The adhesive E may be an epoxy-based adhesive, for example. The receptacle 18, including the upper and lower jigs 18a and 18b, is provided for receiving and loading (i.e., holding) therein a plurality of layers of stacked flat plate members 25, such as a plurality of layers of stacked wafers (collectively called "wafer stack") 25 in a horizontal posture. The injecting portion 24 is removably attachable to the receptacle 18. The receptacle 18, which is circular in shape as viewed from above, has a fitting projection 18c formed along its inner circumference for preventing the adhesive E from flowing out therefrom and for increasing efficiency of heating the interior thereof by the heaters 15, 16. A plurality of fitting projections, rather than just one fitting projection 18c, may be provided in concentric arrangement for the purposes described above. The receptacle 18 may have an additional fitting projection formed on its peripheral edge. The upper and lower jigs 18a and 18b have respective supporting portions 18d and 18e for supporting thereon the wafer stack 25. The receptacle 18 has a gap between the upper and lower jigs 18a and 18b so that the interior of the receptacle 18 can be evacuated to be turned into a vacuum state as the interior of the vacuum chamber 11 is evacuated.

The upper and lower stages 13 and 14 serve to fix the receptacle 18 within the vacuum chamber 11 and is used for heating the thus-fixed receptacle 18. These upper and lower stages 13 and 14 are each formed of a material of good heat conductance, such as a metal material, and have their respective heaters (heating devices) 15 and 16 provided therein. The heaters (heating devices) 15 and 16 are constructed to change the heating temperature in accordance with any of the planar surface area of the flat plate members, size of the gaps between the flat plate members, viscosity of the adhesive E and pressure difference between the interior of the receptacle 18 and the gaps between the flat plate members.

The vacuum chamber 11 opens to, or communicates with, the outside only via the adhesive injecting portion 24, evacuating portion 19a of the pump (evacuation device) 19 and inert gas introduction section 20, and it has a very high sealing capability, The pump 19 serves to evacuate air from the gaps between the flat plate members. The inert gas introduction section 20 includes an inert gas introducing pipe 20a and valve 20b, via which it introduces an inert gas, such as a N2 gas (that alternatively may be atmospheric air), into the vacuum chamber 11. Thus, a pressure difference is produced between the interior of the receptacle 18 and the gaps between the flat plate members, so that the adhesive E can be injected from all around the stacked flat plate members 25 into the gaps between the plate members. Note that the vacuum chamber 11 and receptacle 18 are opened when the stacked flat plate members are to be held in the receptacle 18; however, a mechanism for opening and closing the vacuum chamber 11 etc. is not relevant to the features of the present invention, and thus, illustration of the opening mechanism is omitted in FIG. 1.

Whereas only one pump 19 is shown in FIG. 1, two or more different types of pumps 19 (e.g., oil-sealed rotary vacuum pump and diffuser pump) may be employed to efficiently create a desired vacuum condition within the vacuum chamber 11; in this case, any one of the types of pumps may be used selectively in accordance with the pressure in the vacuum chamber 11.

Figure 2:
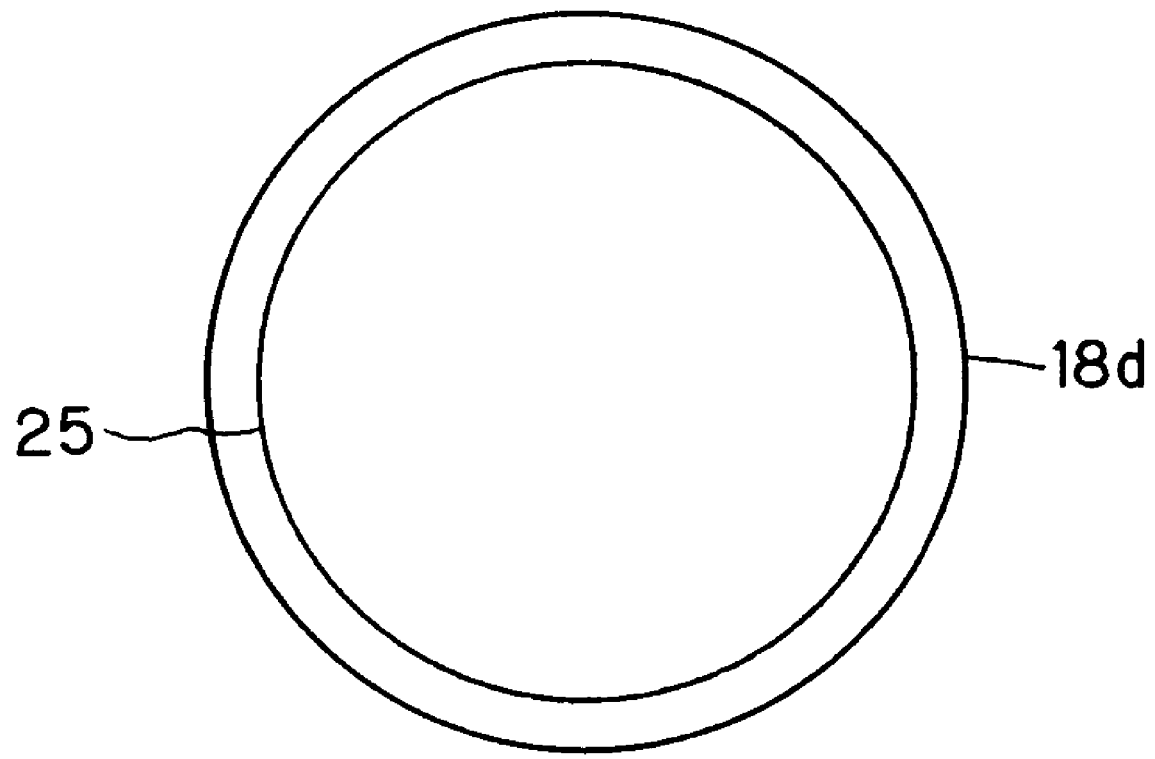
FIG. 2 is a plan view of stacked wafers as an example of layers of flat plate members.

FIG. 2 is a plan view of the stacked wafers (or wafer stack) 25 as an example of the layers of stacked flat plate members. The wafer stack 25 is supported via the supporting portion 18d of the lower jig 18b in an appropriately-balanced horizontal posture. Because the wafer stack 25 is supported on the wide surface of the supporting portion 18d, unnecessary concentrated stress can be effectively prevented from being applied to the wafer stack 25.

FIG. 3 is a vertical sectional view of the wafer stack 25. Each of the wafers in the wafer stack 25 has semiconductor integrated circuitry formed therein, and vertically adjacent ones of the wafers are electrically connected with each other via vertical wiring. Namely, as illustrated in the figure, the semiconductor integrated circuitry in each of the wafers 26, 27 and 28 in the wafer stack 25 includes integrated circuits, based on a multiplicity of MOSFETs (metal-oxide semiconductor field-effect transistors) etc., provided by film formation, etching etc. on its silicon substrate. Each of the wafers 26, 27 and 28 also has trenches, embedded wiring portions 30 and microbumps 31 of an Au—In alloy each formed adjacent an end surface of one of the embedded wiring portions 30, so that the three wafers 26, 27 and 28 are secured together in stacked arrangements through thermocompressing bonding of the microbumps 31. Further, gaps 32 and 33 are formed between the wafers 26, 27 and 28 in the wafer stack 25. Material forming the wafer stack 25 and steps of manufacturing the wafer stack 25 are not relevant to the features of the present invention and will not be described here.

The following paragraphs describe an adhesive injection process according to the present invention.

FIG. 4 is a flow chart showing an example operational sequence of the adhesive injection process performed using the adhesive injection apparatus 10 of the invention. The adhesive injection process generally comprises, a wafer placement step (flat plate member placement step) of placing and holding the wafer stack 25 in a horizontal posture in the receptacle 18, a heating step of heating the interior of the receptacle 18, an evacuation step of evacuating the receptacle 18, an adhesive injection step (or adhesive supply step) of injecting the adhesive into the receptacle 18, and an inert gas introduction step of introducing the inert gas into the receptacle 18 to bring the interior of the receptacle 18 back to the atmospheric pressure level.

The above-mentioned wafer placement step is indicated by steps S101 and S102 in the flow chart of FIG. 4. At step S101, the wafer stack (flat plate member stack) 25, comprising a plurality of layers of stacked wafers as illustrated in FIG. 3, is placed and held in a horizontal posture on the lower jig 18b. At step S102, the upper jig 18a is fitted onto the lower jig 18b, and the interior of the vacuum chamber 11 is placed in a closed and sealed condition.

The above-mentioned heating step is indicated by step S103 in the flow chart of FIG. 4, where the wafer stack 25 is heated by the heaters 15 and 16 within the upper and lower stages 13 and 14. In this heating step, the heating temperature can be changed in accordance with any of the planar surface area of the flat plate members (i.e. wafers 26, 27, 28 in the described embodiment), size of the gaps between the flat plate members, viscosity of the adhesive E and pressure difference between the interior of the receptacle 18 and the gaps between the flat plate members. Namely, the heating temperature of the heater 15 and 16 may be determined in consideration of optimal viscosity of the adhesive E corresponding to the characteristics of the adhesive E, materials and shapes of the upper and lower stages 13 and 14 and the upper and lower jigs 18a and 18b. The present invention allows the adhesive E to be injected more quickly between the flat plate members, by appropriately changing the heating temperature in accordance with an injecting state of the adhesive E.

The above-mentioned evacuation step is indicated by steps S104 and S105 in the flow chart of FIG. 4, where evacuation by the pump 19 is initiated to cause the pressure within the vacuum chamber 11 to approach a vacuum pressure (e.g., $10^{-4}$ mb for an 8-inch wafer) in the vacuum chamber 11.

The above-mentioned adhesive injection step is indicated by steps S106 and S107 in the flow chart of FIG. 4, where the adhesive with a predetermined pressure applied thereto by the piston portion 21 is injected into the lower jig 18b with the valve 23 kept opened. Injected amount of the adhesive E can be identified from a scale (not shown) of the cylinder section 21a. However, the injected amount of the adhesive E may also be determined on the basis of the opening time of the valve 23, flowmeter of the valve 23, or the like. The above-mentioned injected amount of the adhesive only has to be controlled such that all of the gaps in the wafer stack 25 can be fully filled with the adhesive E when the interior of the receptacle 18 has been brought back to the atmospheric pressure level; for example, the injected amount only has to be controlled such that the entire wafer stack 25 can be immersed in the adhesive E within the receptacle 18.

The above-mentioned inert gas introduction step is indicated by steps S108 and S109 in the flow chart of FIG. 4, where the valve 23 is closed and then the N2 gas is introduced from the inert gas introduction section 20 into the vacuum chamber 11 so that the interior of the vacuum chamber 11 is brought back to the atmospheric pressure level by means of the introduced N2 gas. As a consequence, a pressure difference is produced between the interior of the receptacle 18 and the gaps in the layered wafer stack 25, which allows the adhesive E to be injected from all around the wafer stack 25 into the gaps. Note that the atmospheric air may be used in place of the N2 gas.

At step S110, a determination is made as to whether or not a predetermined time has passed, in order to determine whether the adhesive E has spread sufficiently up to the center of the wafer stack 25. The "predetermined time" is determined on the basis of the traveling speed of the adhesive E calculated from the viscosity, injected pressure etc. of the adhesive E and the like, gaps between the wafers of the wafer stack 25, diameter of the wafers, etc. The "predetermined time" may be determined in any other suitable manner; for example, it may be determined on the basis of the amount of the adhesive E, having been injected into the wafer stack 25, which, in turn, may be evaluated from, for example, a reduction in the amount of the adhesive E accumulated in the lower jig 18b.

At step S111, the heating by the heaters 15 and 16 is terminated.

At step S112, the vacuum chamber 11 is opened, the upper and lower jigs 18a and 18b are disengaged from each other and the wafer stack 25 is removed out of the vacuum chamber 11, after which the process goes on to the next step.

FIG. 5 is a view showing a manner in which the adhesive E is injected into the wafer stack 25 at steps S109 and S110, where an arrow 34 indicates an injected direction of the adhesive E. Because, as illustrated in FIG. 5, the adhesive E is injected toward the center of the wafer stack 25, the overall traveling distance of the adhesive is shorter than that in the conventional technique, which can achieve a reduced time of the adhesive injection step and uniform injection of the adhesive E. Note that the adhesive E can be uniformly injected simultaneously into the gaps between the wafers even where the stack 25 comprises three or more layers of wafers.

It was experimentally confirmed that the instant embodiment of this invention allows the adhesive to be injected efficiently into a such a narrow layer-to-layer gap as 3 μm or less in an 8-inch layered wafer, for example.

Whereas the embodiment has been described above in relation to the case where the supporting portions 18d and 18e are greater in planar surface area than the wafer stack 25 as seen in FIGS. 1 and 2, the supporting portions 18d and 18e may be constructed to have a smaller planar surface area than the wafer stack 25.

It should be appreciated that the present invention is applicable to any other workpieces than wafer stacks, such as those where an adhesive is to be injected efficiently into very narrow gaps formed between a plurality of opposed surfaces.

Obviously various minor changes and modifications of the present invention are possible in the light of the above teaching. It is therefore to be understood that within the scope of the appended claims the invention may be practiced otherwise than as specifically described.

What is claimed is:

1. An adhesive injection apparatus for injecting an adhesive into gaps between a plurality of layers of flat plate members, said adhesive injection apparatus comprising:
a vacuum chamber;
a receptacle for holding therein the flat plate members in the vacuum chamber;
means for evacuating an interior of said receptacle and the gaps between the flat plate members;
means for supplying the adhesive into said receptacle; and
means for introducing a gas into said receptacle to produce a pressure difference between the interior of said receptacle and the gaps between the flat plate members, so as to allow the adhesive to be injected from all around the flat plate members into the gaps.

2. An adhesive injection apparatus as claimed in claim 1 wherein said receptacle holds the flat plate members in a horizontal posture.

3. An adhesive injection apparatus as claimed in claim 1 which further comprises heating means for heating said receptacle.

4. An adhesive injection apparatus as claimed in claim 3 wherein said heating means changes a heating temperature thereof in accordance with any of a planar surface area of the flat plate members, size of the gaps between the flat plate members, viscosity of the adhesive and said pressure difference.

5. An adhesive injection apparatus as claimed in claim 1 wherein said means for evacuating an interior is a pump for evacuating the interior of said receptacle.

6. An adhesive injection apparatus as claimed in claim 1, further comprising flat plate members, wherein said flat plate members are stacked wafers each having semiconductor integrated circuitry formed therein, and vertically adjacent ones of the wafers are connected with each other via vertical wiring.

7. An adhesive injection apparatus as claimed in claim 1, further comprising a conduit extending from the adhesive supply means into the receptacle.

8. An adhesive injection apparatus as claimed in claim 1, wherein the receptacle comprises an upper and lower jig.

9. An adhesive injection apparatus as claimed in claim 8, wherein the upper and lower jig each has a heater.

10. An adhesive injection apparatus for injecting an adhesive into gaps between a plurality of layers of flat plate members, said adhesive injection apparatus comprising:
a vacuum chamber;
a receptacle for holding therein the flat plate members in the vacuum chamber;
a pump for evacuating an interior of said receptacle and the gaps between the flat plate members;
an adhesive supply section supplying the adhesive into said receptacle; and
a gas introduction section introducing a gas into said receptacle to produce a pressure difference between the interior of said receptacle and the gaps between the flat plate members, so as to allow the adhesive to be injected from all around the flat plate members into the gaps.

11. The adhesive injection apparatus of claim 10, wherein the receptacle comprises an upper and lower jig.

12. An adhesive injection apparatus as claimed in claim 11, wherein the upper and lower jig each has a heater.

13. An adhesive injection apparatus as claimed in claim 12, wherein said heater changes a heating temperature thereof in accordance with any of a planar surface area of the flat plate members, size of the gaps between the flat plate members, viscosity of the adhesive and said pressure difference.

14. An adhesive injection apparatus as claimed in claim 10, further comprising a conduit extending from the adhesive supply means into the receptacle.

* * * * *